(12) United States Patent
Lee et al.

(10) Patent No.: US 12,171,109 B2
(45) Date of Patent: Dec. 17, 2024

(54) FLEXIBLE DISPLAY PANEL, FLEXIBLE DISPLAY DEVICE AND METHOD OF FORMING FLEXIBLE DISPLAY PANEL

(71) Applicants: Chengdu BOE Optoelectronics Technology Co., Ltd., Sichuan (CN); BOE Technology Group Co., Ltd., Beijing (CN)

(72) Inventors: Myoungsoo Lee, Beijing (CN); Jaeho Lee, Beijing (CN); Qianshu Li, Beijing (CN); Zhen Sun, Beijing (CN); Cheng Zeng, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 501 days.

(21) Appl. No.: 17/523,517

(22) Filed: Nov. 10, 2021

(65) Prior Publication Data

US 2022/0158109 A1    May 19, 2022

(30) Foreign Application Priority Data

Nov. 16, 2020 (CN) .......................... 202011275712.6

(51) Int. Cl.
H10K 50/115    (2023.01)
H10K 50/86    (2023.01)
(Continued)

(52) U.S. Cl.
CPC ......... H10K 50/115 (2023.02); H10K 50/865 (2023.02); H10K 59/122 (2023.02);
(Continued)

(58) Field of Classification Search
CPC ...... H10K 59/35; H10K 59/122; H10K 59/38; H10K 77/111; H10K 50/115;
(Continued)

(56) References Cited

U.S. PATENT DOCUMENTS 11,785,825 B2 * 10/2023 Huang .................. H10K 59/38
257/91
2015/0048348 A1    2/2015 Huang et al.
(Continued)

FOREIGN PATENT DOCUMENTS

CN    104377226 A    2/2015
CN    108345142 A    7/2018
(Continued)

OTHER PUBLICATIONS

CN 202011275712.6 first office action.

*Primary Examiner* — Mouloucoulaye Inoussa
(74) *Attorney, Agent, or Firm* — IPro, PLLC

(57) ABSTRACT

A flexible display panel, a flexible display device and a method of forming the flexible display panel are provided. The flexible display panel includes: a substrate; thin film transistors arranged in an array on the substrate; an electroluminescent device arranged on the thin film transistors and driven by the thin film transistors, including a pixel defining layer and an electroluminescent material defined by the pixel defining layer;

a thin film encapsulation layer on the electroluminescent device; a quantum dot photoconversion layer on the thin film encapsulation layer, including an isolation portion and a quantum dot luminescent material surrounded by the isolation portion, where an orthographic projection of the isolation portion onto the substrate covers an orthographic pro-
(Continued)

jection of the pixel defining layer onto the substrate; and a cover plate arranged on the quantum dot photoconversion layer.

7 Claims, 5 Drawing Sheets

(51) Int. Cl.
    *H10K 59/12*     (2023.01)
    *H10K 59/122*     (2023.01)
    *H10K 59/35*     (2023.01)
    *H10K 59/38*     (2023.01)
    *H10K 71/00*     (2023.01)
    *H10K 77/10*     (2023.01)
    *H10K 102/00*     (2023.01)

(52) U.S. Cl.
    CPC .............. *H10K 59/35* (2023.02); *H10K 59/38* (2023.02); *H10K 71/00* (2023.02); *H10K 77/111* (2023.02); *H10K 59/1201* (2023.02); *H10K 2102/311* (2023.02)

(58) Field of Classification Search
    CPC ............... H10K 50/865; H10K 50/844; H10K 59/1201; H10K 50/852; H10K 59/879; H10K 50/858; H10K 50/8445; H10K 59/8731; H10K 59/12; H10K 50/854; H10K 85/654; H10K 30/865; H10K 85/6572; H10K 50/16; H10K 50/15; H10K 59/352; H10K 59/126; H10K 77/10; H10K 2102/331; H10K 2102/311; H10K 2102/351; Y02E 10/549; G02B 5/206; G02B 5/201; G02B 5/0242; G02B 5/207; G02B 5/0278; G02B 5/20; G02B 5/22; G02B 6/0003; H01L 27/016; H01L 27/1251; H01L 27/0218; H01L 29/41733; H01L 29/0653; H01L 29/786; H01L 33/502; H01L 33/507; H01L 25/167; H01L 33/44; G02F 1/133305; G02F 1/133308; G02F 1/1347; G02F 1/1343; G02F 1/1533; G02F 1/13306; G02F 1/133723; G02F 1/133617; G02F 1/133528; G02F 1/134309; G02F 1/1368; G02F 1/133357; G02F 1/133548; G02F 1/133614; G02F 2202/36; G02F 2203/30; G02F 2201/123; G09F 9/301; H05B 33/14; C09K 11/025; C09K 11/08; C09K 2323/03
    See application file for complete search history.

(56) References Cited

U.S. PATENT DOCUMENTS

| | | | |
|---|---|---|---|
| 2015/0145405 A1 | 5/2015 | Yang et al. | |
| 2018/0074369 A1* | 3/2018 | Park | G02F 1/133528 |
| 2018/0210280 A1* | 7/2018 | Chen | H10K 50/8445 |
| 2018/0210282 A1* | 7/2018 | Song | G02F 1/133514 |
| 2018/0212051 A1 | 7/2018 | Wu | |
| 2018/0299081 A1* | 10/2018 | Zhu | F21K 9/64 |
| 2019/0252365 A1* | 8/2019 | Chen | H01L 27/016 |
| 2020/0041709 A1* | 2/2020 | Lee | G02F 1/133528 |
| 2020/0073169 A1* | 3/2020 | Jung | G02F 1/133617 |
| 2020/0081173 A1* | 3/2020 | Tak | H01L 25/0753 |
| 2020/0089047 A1* | 3/2020 | Baek | G02F 1/133504 |
| 2020/0133077 A1* | 4/2020 | Lin | G02F 1/133609 |
| 2020/0135811 A1* | 4/2020 | Jung | H10K 59/38 |
| 2020/0168668 A1* | 5/2020 | Kim | H10K 59/351 |
| 2020/0185638 A1* | 6/2020 | Choi | H10K 59/122 |
| 2020/0212109 A1* | 7/2020 | Lee | G02F 1/133514 |
| 2020/0219935 A1* | 7/2020 | Ahn | H10K 59/122 |
| 2020/0227484 A1* | 7/2020 | Lin | G02F 1/133723 |
| 2020/0258946 A1* | 8/2020 | Kim | H10K 50/115 |
| 2020/0312916 A1* | 10/2020 | Kim | H10K 50/115 |
| 2020/0321400 A1* | 10/2020 | Park | H10K 50/865 |
| 2020/0328383 A1* | 10/2020 | Song | H10K 50/852 |
| 2020/0335562 A1* | 10/2020 | Kim | H10K 59/122 |
| 2020/0343310 A1* | 10/2020 | Bae | G02F 1/133617 |
| 2020/0343315 A1* | 10/2020 | Lin | H10K 59/38 |
| 2020/0388654 A1* | 12/2020 | Lee | H10K 59/38 |
| 2020/0395416 A1* | 12/2020 | Bae | G02B 5/201 |
| 2021/0005875 A1* | 1/2021 | Lee | C01G 53/00 |
| 2021/0028327 A1* | 1/2021 | Lin | H10K 59/38 |
| 2021/0036062 A1* | 2/2021 | Kim | H10K 59/38 |
| 2021/0074770 A1* | 3/2021 | Choe | G02B 5/0242 |
| 2021/0083216 A1* | 3/2021 | Su | H10K 50/15 |
| 2021/0091161 A1* | 3/2021 | Baek | H10K 50/844 |
| 2021/0091324 A1* | 3/2021 | Jung | H05B 33/14 |
| 2021/0143222 A1* | 5/2021 | Song | H10K 59/38 |
| 2021/0185776 A1* | 6/2021 | Lin | H05B 33/14 |
| 2021/0210558 A1 | 7/2021 | Huo | |
| 2021/0217990 A1* | 7/2021 | Kim | H10K 59/8792 |
| 2021/0280750 A1* | 9/2021 | Park | H01L 33/0095 |
| 2021/0288117 A1* | 9/2021 | Lim | H10K 71/00 |
| 2021/0321400 A1* | 10/2021 | Takeda | H04W 72/0453 |
| 2021/0336224 A1* | 10/2021 | Yun | H10K 71/00 |
| 2021/0351238 A1* | 11/2021 | Park | G02B 5/206 |
| 2021/0359010 A1* | 11/2021 | Kang | H10K 59/12 |
| 2021/0359078 A1* | 11/2021 | Kim | H10K 59/38 |
| 2022/0005875 A1* | 1/2022 | Ahn | H10K 59/353 |
| 2022/0020965 A1* | 1/2022 | Park | H10K 50/858 |
| 2022/0037411 A1* | 2/2022 | Zhang | H10K 50/865 |
| 2022/0052296 A1* | 2/2022 | Noh | H10K 50/852 |
| 2022/0085334 A1* | 3/2022 | Oh | H10K 50/19 |
| 2022/0209157 A1* | 6/2022 | Lee | H10K 50/131 |
| 2022/0278174 A1* | 9/2022 | Yu | G02F 1/134345 |
| 2022/0320181 A1* | 10/2022 | Zhang | G02F 1/133514 |
| 2022/0352487 A1* | 11/2022 | Li | H10K 59/122 |
| 2022/0399530 A1 | 12/2022 | Han et al. | |

FOREIGN PATENT DOCUMENTS

| | | |
|---|---|---|
| CN | 111162200 A | 5/2020 |
| CN | 111261665 A | 6/2020 |
| CN | 111341816 A | 6/2020 |
| CN | 111416048 A | 7/2020 |
| CN | 111508991 A | 8/2020 |

* cited by examiner

FLEXIBLE DISPLAY PANEL, FLEXIBLE DISPLAY DEVICE AND METHOD OF FORMING FLEXIBLE DISPLAY PANEL

CROSS-REFERENCE TO RELATED APPLICATION

The present disclosure claims priority to Chinese Patent Application No. 202011275712.6 filed in China on Nov. 16, 2020, the disclosure of which is hereby incorporated by reference in its entirely.

TECHNICAL FIELD

The present disclosure relates to the field of display technology, in particular to a flexible display panel, a flexible display device and a method of forming the flexible display panel.

BACKGROUND

The rapid development of OLED (Organic Light Emitting Diode) display technology has promoted the rapid development and entry of technologies such as curved surface and flexible display touch products into the market, and new technologies continue to emerge.

Especially represented by QD-OLED technology, QD-OLED is a new type of technology that combines OLED electroluminescence and quantum dot (QD) photoluminescence technology. QD (Quantum Dot, quantum dot) technology belongs to the new semiconductor nanocrystal technology, which improves the color gamut and viewing angle. White QD OLED is a combination of White QD and OLED technology, which makes the color of the display device more pure and bright, and the color purity is higher than that of traditional OLED, and the high-pixel display may be realized without the restriction of the FMM process (Fine Metal Mask high-precision metal mask process). However, in the prior art, since the thickness of the White QD film layer is relatively thicker than other film layers, it is easy to cause visual role deviation.

SUMMARY

In view of this, embodiments of the present disclosure provide a flexible display panel, a flexible display device and a method of forming the flexible display panel.

A flexible display panel is provided in the present disclosure, including:
- a substrate;
- thin film transistors arranged in an array on the substrate;
- an electroluminescent device arranged on the thin film transistors and driven by the thin film transistors, including a pixel defining layer and an electroluminescent material defined by the pixel defining layer;
- a thin film encapsulation layer on the electroluminescent device;
- a quantum dot photoconversion layer on the thin film encapsulation layer, including an isolation portion and a quantum dot luminescent material surrounded by the isolation portion, where an orthographic projection of the isolation portion onto the substrate covers an orthographic projection of the pixel defining layer onto the substrate; and
- a cover plate arranged on the quantum dot photoconversion layer.

Optionally, the electroluminescent material is a blue light material, and the electroluminescent device is configured to emit blue light.

Optionally, the quantum dot luminescent material is a first material configured to emit white light after being excited by the blue light emitted by the electroluminescent device;
the flexible display panel further includes a color film layer on the quantum dot photoconversion layer and including a black matrix and a filter film defined by the black matrix, where
an orthographic projection of the black matrix onto the substrate covers the orthographic projection of the isolation portion on the substrate;
an orthographic projection of the filter film onto the substrate covers an orthographic projection of the quantum dot luminescent material onto the substrate, where the filter film includes a red filter film, a green filter film and a blue filter film corresponding to three sub-pixels of each pixel of the flexible display panel.

Optionally, the first material includes mixed red quantum dots and green quantum dots.

Optionally, the quantum dot luminescent material includes a second material, a third material and a fourth material, and the second material, the third material and the fourth material respectively correspond to three sub-pixels in each pixel of the flexible display panel, where
the second material is configured to emit red light after being excited by the blue light emitted by the electroluminescent device;
the third material is configured to emit green light after being excited by the blue light emitted by the electroluminescent device; and
the fourth material is configured to transmit the blue light emitted by the electroluminescent device.

Optionally, the second material consists of red quantum dots, and the third material consists of green quantum dots.

Optionally, the flexible display panel further includes a polarizer arranged on the quantum dot luminescent material.

Optionally, a cross section of the isolation portion in a direction perpendicular to the substrate is one of a trapezoid, a rectangle and a triangle.

A flexible display device is further provided in the present disclosure, including a flexible display panel, where the flexible display panel includes:
- a substrate;
- thin film transistors arranged in an array on the substrate;
- an electroluminescent device arranged on the thin film transistors and driven by the thin film transistors, including a pixel defining layer and an electroluminescent material defined by the pixel defining layer;
- a thin film encapsulation layer on the electroluminescent device;
- a quantum dot photoconversion layer on the thin film encapsulation layer, including an isolation portion and a quantum dot luminescent material surrounded by the isolation portion, where an orthographic projection of the isolation portion onto the substrate covers an orthographic projection of the pixel defining layer onto the substrate; and
- a cover plate arranged on the quantum dot photoconversion layer.

Optionally, the electroluminescent material is a blue light material, and the electroluminescent device is configured to emit blue light.

Optionally, the quantum dot luminescent material is a first material configured to emit white light after being excited by the blue light emitted by the electroluminescent device;

the flexible display panel further includes a color film layer on the quantum dot photoconversion layer and including a black matrix and a filter film defined by the black matrix, where an orthographic projection of the black matrix onto the substrate covers the orthographic projection of the isolation portion on the substrate;

an orthographic projection of the filter film onto the substrate covers an orthographic projection of the quantum dot luminescent material onto the substrate, where the filter film includes a red filter film, a green filter film and a blue filter film corresponding to three sub-pixels of each pixel of the flexible display panel.

Optionally, the first material includes mixed red quantum dots and green quantum dots.

Optionally, the quantum dot luminescent material includes a second material, a third material and a fourth material, and the second material, the third material and the fourth material respectively correspond to three sub-pixels in each pixel of the flexible display panel, where the second material is configured to emit red light after being excited by the blue light emitted by the electroluminescent device;

the third material is configured to emit green light after being excited by the blue light emitted by the electroluminescent device; and the fourth material is configured to transmit the blue light emitted by the electroluminescent device.

Optionally, the second material consists of red quantum dots, and the third material consists of green quantum dots.

Optionally, the flexible display panel further includes a polarizer arranged on the quantum dot luminescent material.

Optionally, a cross section of the isolation portion in a direction perpendicular to the substrate is one of a trapezoid, a rectangle and a triangle.

A method of forming the flexible display panel hereinabove is further provided in the present disclosure, including:

forming thin film transistors in an array on the substrate;

forming an electroluminescent device driven by the thin film transistor on the thin film transistor, where the electroluminescent device includes a pixel defining layer and an electroluminescent material defined by the pixel defining layer;

forming a thin film encapsulation layer on the electroluminescent device;

forming a quantum dot photoconversion layer on the thin film encapsulation layer, where the quantum dot photoconversion layer includes an isolation portion and a quantum dot luminescent material surrounded by the isolation portion, where an orthographic projection of the isolation portion onto the substrate covers an orthographic projection of the pixel defining layer onto the substrate; and forming a cover plate on the quantum dot photoconversion layer.

Optionally, the electroluminescent material is a blue light material, the electroluminescent device is configured to emit blue light, and the quantum dot luminescent material is a first material, and the quantum dot luminescent material is configured to emit white light after being excited by the blue light emitted by the electroluminescent device, and the method further includes:

forming a color film layer on the quantum dot photoconversion layer, where the color film layer includes a black matrix and a filter film defined by the black matrix, where an orthographic projection of the black matrix onto the substrate covers the orthographic projection of the isolation portion on the substrate;

an orthographic projection of the filter film onto the substrate covers an orthographic projection of the quantum dot luminescent material onto the substrate, where the filter film includes a red filter film, a green filter film and a blue filter film corresponding to three sub-pixels of each pixel of the flexible display panel.

Optionally, the electroluminescent material is a blue light material, the electroluminescent device is configured to emit blue light, the quantum dot luminescent material includes a second material, a third material and a fourth material, and the second material, the third material and the fourth material respectively correspond to three sub-pixels in each pixel of the flexible display panel, where the second material is configured to emit red light after being excited by the blue light emitted by the electroluminescent device;

the third material is configured to emit green light after being excited by the blue light emitted by the electroluminescent device; and the fourth material is configured to transmit the blue light emitted by the electroluminescent device;

the method further includes:

forming a polarizer on the quantum dot luminescent material.

BRIEF DESCRIPTION OF THE DRAWINGS

In order to explain the technical solutions in the embodiments of the present disclosure more clearly, the following will briefly introduce the drawings used in the description of the embodiments. Obviously, the drawings in the following description are only some embodiments of the present disclosure. For those of ordinary skill in the art, other drawings can be obtained based on these drawings without creative work.

DETAILED DESCRIPTION

Figure 1:
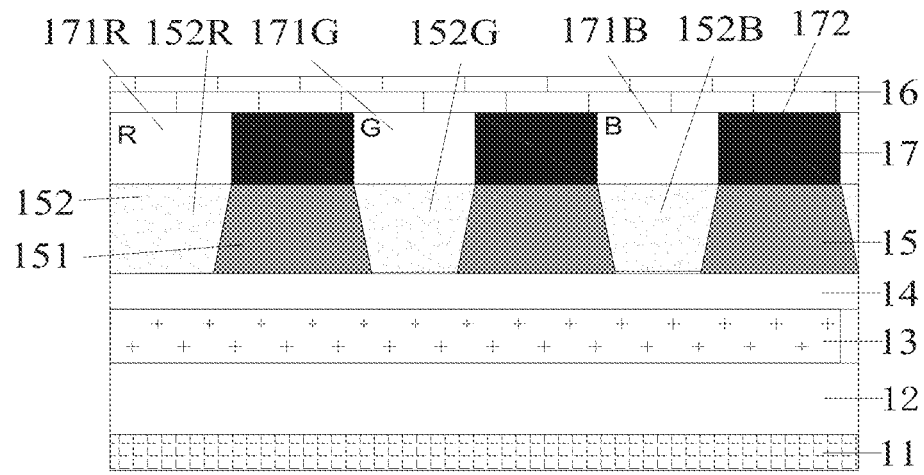
FIG. 1 is a schematic structural view of a flexible display panel according to an embodiment of the present disclosure.
Figure 2:
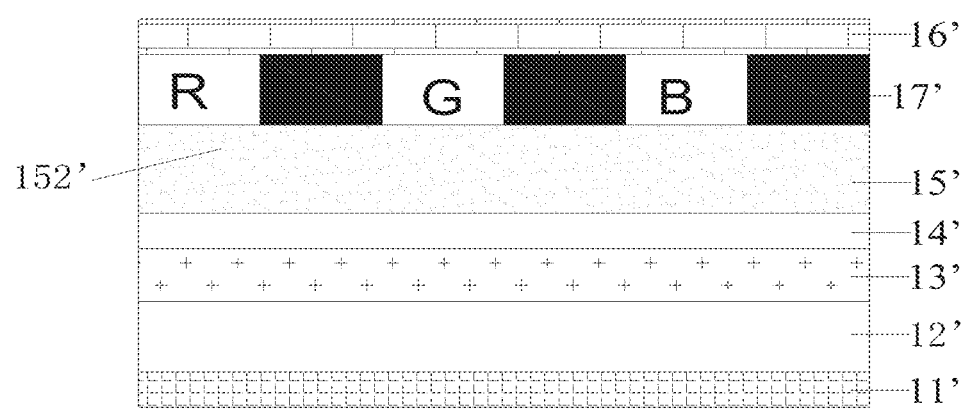
FIG. 2 is a schematic view of a structure of a flexible display panel in the prior art.

In order to explain the present disclosure more clearly, the following further describes the present disclosure in combination with preferred embodiments and the accompanying drawings. Similar components in the drawings are denoted by the same reference numerals. Those skilled in the art should understand that the content described below is illustrative rather than restrictive, and should not be used to limit the protection scope of the present disclosure.

It should be noted that "on", "formed on" and "on" in this article can mean that one layer is directly formed or on another layer, or it can mean a layer A layer is formed indirectly or arranged on another layer, that is, there are other layers between the two layers. In the present disclosure, unless otherwise specified, the term "located on the same layer" used means that two layers, parts, components, elements or parts can be formed by the same patterning process, and the two layers, parts, components, the elements or parts are generally formed of the same material.

In the present disclosure, unless otherwise specified, the expression "patterning process" generally includes the steps of photoresist coating, exposure, development, etching, and photoresist stripping. The expression "one-time patterning process" means a process of forming patterned layers, parts, components, etc., using one mask.

In the prior art, a schematic view of the structure of a flexible display panel 1' is shown in FIG. 14', quantum dot photoconversion layer 15', color film layer 17' and cover plate 16'. The thin film transistor 12' drives the electroluminescent device 13' to perform electroluminescence. The electroluminescent beam excites the internal quantum luminescent material of the quantum dot photoconversion layer 15' so that the quantum luminescent material 152' is excited and emits a quantum dot beam. The spot light beam forms a full-color display after passing through the color film layer 17'. However, the flexible display panel in the related art is prone to color shift during display.

In view of the above technical issues, it is founded that during the process of the quantum dot photoconversion layer 15' being excited to emit light, the quantum dot luminescent material 152' corresponding to each sub-pixel in the color film layer 17' will be exposed to the electricity of the adjacent sub-pixels. The influence of the electroluminescent light beam, and then the formation of color shift. Moreover, the existing quantum dot photoconversion layer 15' is limited by the process, and its thickness is relatively thick, which results in stronger scattering of the quantum luminescent material in the quantum dot photoconversion layer 15', which further aggravates the color shift of the flexible display panel.

To solve the above-mentioned problems, an embodiment of the present disclosure provides a flexible display panel, a flexible display device, and a method of forming the flexible display panel.

As shown in FIG. 1, an embodiment of the present disclosure provides a flexible display panel 1, including:
   a substrate 11;
   thin film transistors 12 arranged in an array on the substrate 11;
   an electroluminescent device 13 arranged on the thin film transistors 12 and driven by the thin film transistors 12, including a pixel defining layer and an electroluminescent material defined by the pixel defining layer;
   a thin film encapsulation layer 14 on the electroluminescent device 13;
   a quantum dot photoconversion layer 15 on the thin film encapsulation layer 14, including an isolation portion 151 and a quantum dot luminescent material 152 surrounded by the isolation portion 151, where an orthographic projection of the isolation portion 151 onto the substrate 11 covers an orthographic projection of the pixel defining layer onto the substrate 11; and
   a cover plate 6 arranged on the quantum dot photoconversion layer 15.

According to the present disclosure, the adjacent quantum dot luminescent materials are isolated through isolation portions, thereby reducing the influence on quantum dot luminescent materials due to excitation of adjacent pixels, and making the quantum dot beams after the quantum dot luminescent materials are excited by the electroluminescent device more concentrated, reducing the disordered scattering of the quantum dot beams, thereby reducing the color shift of the flexible display panel, remedying the problems in the prior art, and effectively improving the display effect of the flexible display panel, which has a broader application prospects.

In an embodiment of the present disclosure, as shown in FIG. 1, under the driving of the thin film transistor 12, the electroluminescent material defined by the pixel defining layer in the electroluminescent device 13 performs electroluminescence. In an embodiment of the present disclosure, the electroluminescent material is a blue light material, and the electroluminescent device 13 emits blue light after being driven. The blue light beam excites the quantum luminescent material 152 in the quantum dot photoconversion layer 15 so that the quantum dot luminescent material 152 emits a quantum dot light beam. Due to the existence of the isolation portion 151, the quantum dot luminescent material 152 corresponding to each sub-pixel defining layer forms a separate quantum dot light-emitting area, and adjacent quantum dot light-emitting areas are separated by the isolation portion 151, which effectively avoids differences. The mutual influence between the quantum dot luminescent materials 152 in the region effectively reduces the disordered scattering of the quantum dot beam, thereby reducing the color shift of the flexible display panel.

In an embodiment of the present disclosure, a cross section of the isolation portion 151 in a direction perpendicular to the substrate 11 is one of a trapezoid, a rectangle and a triangle. In an embodiment of the present disclosure, the isolation portion 151 surrounds the quantum dot luminescent material 152, and the isolation portion 151 can be surrounded by various structures. For example, when the cross section of the isolation portion 151 perpendicular to the direction of the substrate 11 is trapezoidal, the cross-section is a trapezoidal cross-section as shown in FIG. 1, when viewed from the top view of the flexible panel, the isolation portion 151 completely wraps the corresponding quantum dot luminescent material 152 to form each quantum light-emitting area isolated from each other.

Those skilled in the art should select the structure of the isolation portion 151 according to actual needs, so that the isolation portion 151 surrounds the quantum dot luminescent material 152 to form a quantum dot light-emitting area that does not interfere with each other.

In an embodiment of the present disclosure, as shown in FIG. 1, the quantum dot luminescent material 152 is a first material, which emits white light after being excited by the blue light emitted by the electroluminescent device 13;

The flexible display panel 1 further includes a color film layer 17 on the quantum dot photoconversion layer 15, including a black matrix 171 and a filter film defined by the black matrix, where an orthographic projection of the black matrix onto the substrate covers the orthographic projection of the isolation portion 151 on the substrate;
   an orthographic projection of the filter film onto the substrate covers an orthographic projection of the quantum dot luminescent material 152 onto the substrate, where the filter film includes a red filter film 171R, a green filter film 171G and a blue filter film 171B corresponding to three sub-pixels of each pixel of the flexible display panel.

In an embodiment of the present disclosure, the quantum dot luminescent material 152 is excited by the electroluminescent device 13 to perform photoluminescence and emit a white quantum dot beam, thereby making the display color of the flexible display panel more vivid. Moreover, due to the existence of the isolation portion 151, the adjacent quantum dot luminescent materials 152 surrounded by the isolation portion 151 will not interfere with each other, thereby reducing the color shift.

In an embodiment of the present disclosure, the first material includes mixed red quantum dots and green quantum dots. In an embodiment of the present disclosure, as shown in FIG. 1, adjacent isolation portions 151 form a quantum dot light-emitting area, and each quantum dot light-emitting area is filled with mixed red quantum dots and green quantum dots. The red quantum dots in the quantum light-emitting area are configured to convert blue light emitted by the electroluminescent material corresponding to the light-emitting area into red light, and the green quantum dots are configured to convert the blue light emitted by the electroluminescent material corresponding to the light-emitting area into green light. The quantum dot photoconversion layer 15 mixes the converted red light, green light and the blue light directly transmitted through the electroluminescent device 13 of the first material to form a white quantum beam and emit the same.

In an embodiment of the present disclosure, the white quantum light beam of the quantum dot photoconversion layer is output after passing through the color film layer 17 to form a full-color display.

The black matrix 172 in the color film layer 17 corresponds to the isolation portion 151 in a one-to-one correspondence, thereby forming a filter film separated from each other by the black matrix 172, and each filter film corresponds to a quantum dot luminescent material, so that the quantum dot luminescent material The quantum dot beam can concentrate and filter light, effectively improving the display effect. Moreover, in this embodiment, the wavelength of the monochromatic filter film can be adjusted through the color film layer, so as to realize the adjustment of the reflective brightness and further improve the display effect.

In a specific example, as shown in FIG. 1, the filter film of one pixel of the flexible display panel 1 includes three sub-pixel monochromatic filter films, namely, a red filter film 171R, a green filter film 171G, and a blue filter film 171B. Each monochromatic filter film corresponds to a quantum light-emitting area where a quantum luminescent material is located. That is, the white light beam emitted by the quantum light emitting area 152R is displayed as red light after passing through the red filter film 171R, the white light beam emitted by the quantum light emitting area 152G is displayed as green light after passing through the green filter film 171G, and the white light beam emitted by the quantum light emitting area 152B after passing through the blue filter film 171B is displayed as blue light, thereby forming a full-color display. In this structure, the white light beams emitted by the quantum dot luminescent material 152 in each quantum light-emitting area are all concentrated and filtered, which can eliminate the influence of adjacent quantum light-emitting areas, and it can also eliminate the difference between adjacent filter films of different colors. The effect of light filtering effectively reduces the color cast, improves the display effect, and has a wide range of application scenarios.

In the embodiment of the present disclosure, the process flow of the quantum dot photoconversion layer 15 with the isolation portion 151 is simple to operate, and the process flow of the substrate, thin film transistor, electroluminescent device, and thin film encapsulation layer is the same as the OLED process in the prior art, specifically:

a thin film transistor 12, an electroluminescent device 13, and a thin film encapsulation layer 14 are sequentially stacked on the substrate 11.

Figure 4A:
FIGS. 4a-4f are schematic views of a method of forming a flexible display panel according to an embodiment of the present disclosure.
Figure 4B:
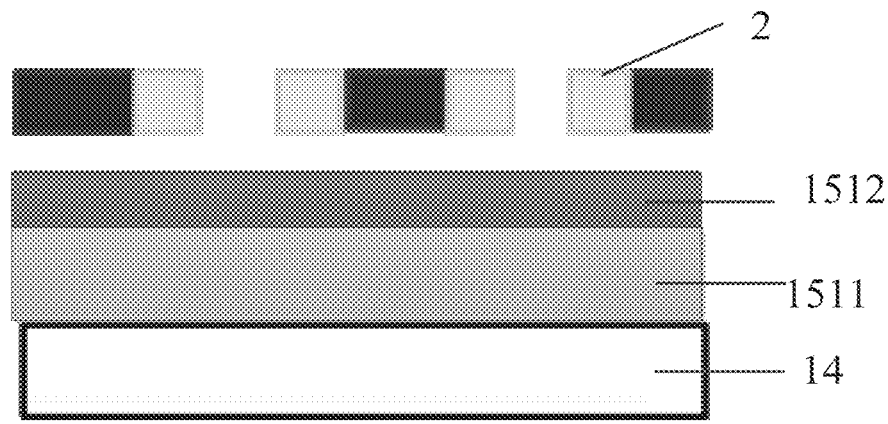
Figure 4C:
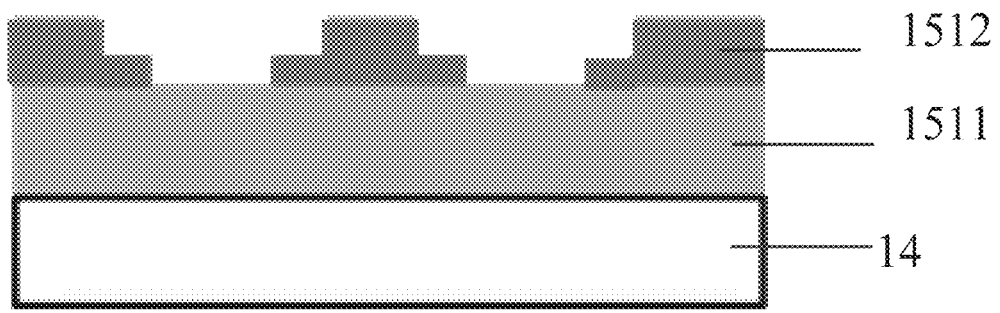

Further, a quantum dot photoconversion layer 15 with isolation portions 151 is formed on the thin film encapsulation layer 14. As shown in FIG. 4a, first, an isolation layer 1511 and a photoresist layer 1512 on the isolation layer 1511 are formed on the thin film encapsulation layer 14 through a coating process; then, as shown in FIG. The mask plate 2 is subjected to a laser etching process, and the photoresist layer 1512 is laser etched with different brightness to form a first photoresist layer and a second photoresist layer with different projection areas on the same center. The second photoresist layer is exposed outside the first photoresist layer, the projected area of the second photoresist layer corresponding to the substrate 11 is larger than the projected area of the first photoresist layer, and the thickness of the second photoresist layer is smaller than the thickness of the first photoresist layer. As shown in FIG. 4c, the adjacent second photoresist layers are completely etched, and the corresponding isolation layer 1511 is exposed outside.

Figure 4D:
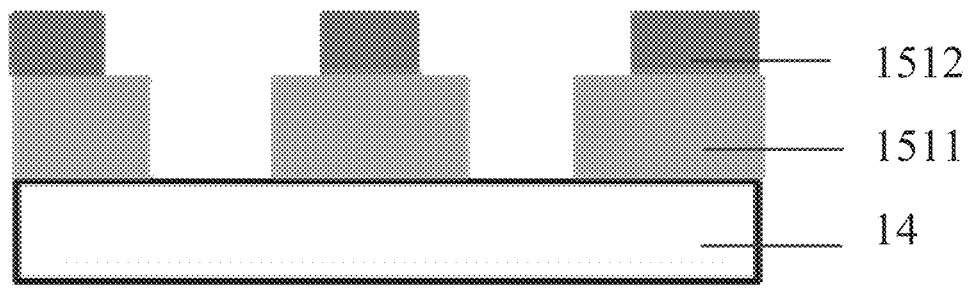
Figure 4E:
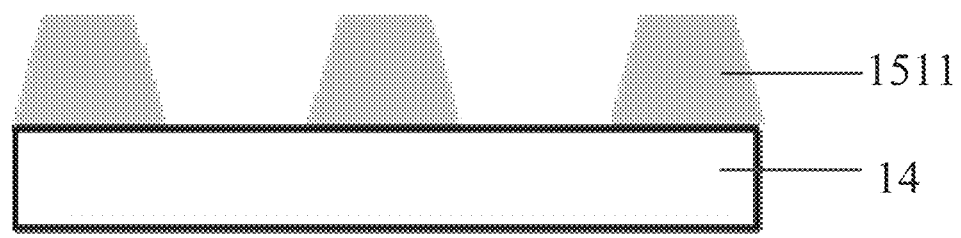

Further, the first photoresist layer, the second photoresist layer and the isolation layer 1511 exposed to the outside are etched. After this etching, as shown in FIG. 4d, the isolation layer 1511 exposed on the outside is completely etched to form a through hole that penetrates the entire isolation layer 1511. The through hole exposes the thin film encapsulation layer 14, the thicker first photoresist layer is partially etched, the second photoresist layer with a thinner thickness exposed outside the first photoresist layer is completely etched, and the corresponding isolation layer 1511 of the second photoresist layer is exposed again. It is noted that the through hole is in the projection direction corresponding to the substrate 11, and the isolation layer 1511 formed by this etching is a surrounding structure surrounding the through hole.

Furthermore, the etching process is performed again to completely remove all the photoresist layer 1512 and the isolation layer 1511 exposed to the outside is etched, thereby forming an isolation layer 1511 with a trapezoidal cross-section as shown in FIG. The quantum dot material region between adjacent isolation layers 1511. It is noted that the isolation layer 1511 corresponds to the projection direction of the substrate 11, and the isolation layer 1511 is a surrounding structure surrounding the quantum dot luminescent material. It should also be noted that the cross-section of the isolation layer 1511 is not limited to a trapezoid, such as the rectangle shown in FIG. 4d.

Then, an inorganic layer is formed on the exposed surfaces of the isolation layer 1511 and the thin film encapsulation layer 14 to form the isolation portion 151 and the quantum dot light-emitting area where the quantum dot luminescent material 152 surrounded by the isolation portion 151 is located in the embodiment of the present disclosure. The orthographic projection of the formed isolation portion 151 on the substrate 11 covers the orthographic projection of the pixel defining layer on the substrate 11. The isolation portion 151 and the quantum dot luminescent material 152 surrounded by the isolation portion 151 form the quantum dot photoconversion layer 15 of this embodiment.

Figure 4F:
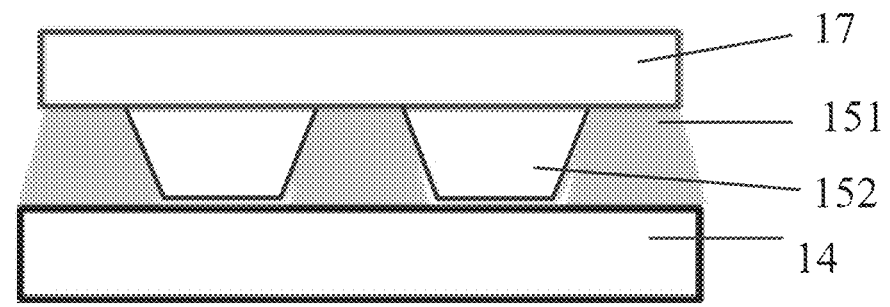

As shown in FIG. 4f, the color film layer 17 is formed on the quantum dot photoconversion layer 15. In an embodiment of the present disclosure, the process flow of forming the color film layer is similar to the aforementioned forming the quantum dot photoconversion layer, specifically:

a black matrix layer covering the quantum dot photoconversion layer 15 is formed on the quantum dot photoconversion layer 15, and the black matrix layer is etched through the third etching process, so that the black matrix layer corresponds to the quantum dot luminescent material 152 is completely etched, and the quantum dot luminescent material 152 in the area is exposed for emission of the quantum dot beam. The black matrix layer and the isolation portion 151 form the black matrix 172 in a one-to-one correspondence, that is, the orthographic projection of the black matrix 172 on the substrate covers the orthographic projection of the isolation portion on the substrate, Thereby, the filter film regions isolated from each other are formed by the black matrix 172.

Further, a monochromatic filter film corresponding to the quantum dot luminescent material 152 is formed in the filter film area, and the monochromatic filter film corresponds to three sub-pixels of one pixel of the flexible display panel 1, for example, a red filter film. 171R, green filter film 171G, and blue filter film 171B; that is, the orthographic projection of each monochromatic filter film on the substrate covers the orthographic projection of the corresponding quantum dot luminescent material on the substrate. The black matrix 172 and the filter films (the red filter film 171R, the green filter film 171G, and the blue filter film 171B) form the color film layer 17 of the embodiment of the present disclosure. The black matrix isolates each sub-pixel of a pixel, reducing the influence of the filter film surrounded by the adjacent black matrix on the quantum dot luminescent material, so that the quantum dot beam of the quantum dot luminescent material can be concentrated and filtered, effectively improving the display effect.

Finally, a cover plate 16 is formed on the color film layer. Thus, the flexible display panel 1 with mixed color quantum dots according to the embodiment of the present disclosure is formed.

The flexible display panel formed by the mixed quantum dot luminescent material, on the one hand, isolates adjacent quantum dot luminescent materials through the isolation portion, thereby reducing the influence of the quantum dot luminescent material being excited by adjacent pixels, and making the quantum dot beams after the quantum dot luminescent materials are excited by the electroluminescent device more concentrated, reducing the disordered scattering of the quantum dot beams, thereby reducing the color shift of the flexible display panel;

on the other hand, each sub-pixel of a pixel is isolated by a black matrix to reduce the influence of the filter film surrounded by the adjacent black matrix on the quantum dot luminescent material, enables the quantum dot beam of the quantum dot luminescent material to be concentrated and filtered, which effectively improves the display effect; and the wavelength of the monochromatic filter film can be adjusted through the color film layer to achieve reflection. The adjustment of the brightness further improves the display effect, makes up for the problems existing in the prior art, effectively improves the display effect of the flexible display panel, and has a wide range of application prospects.

Figure 3:
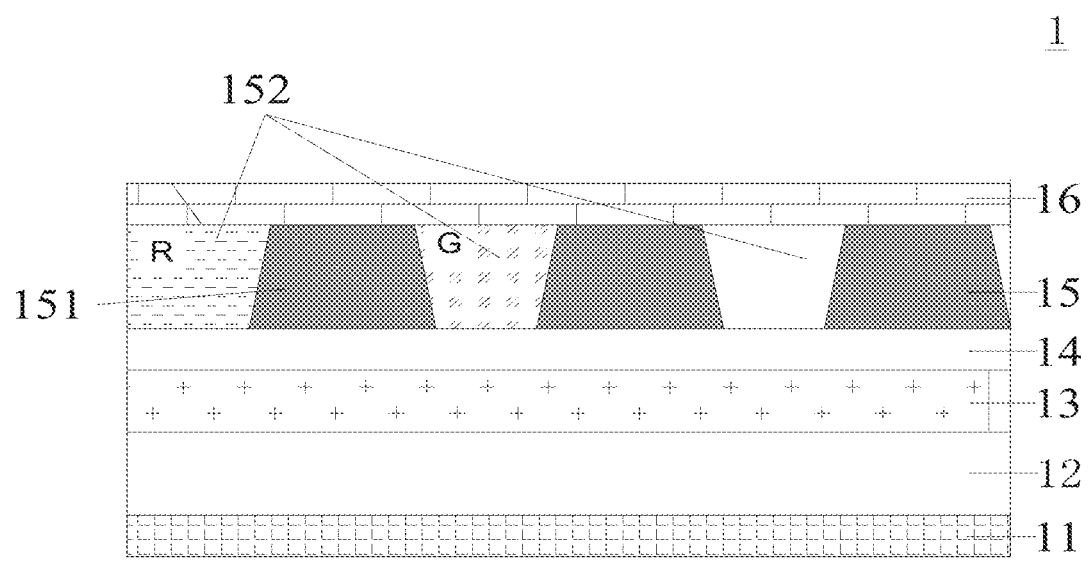
FIG. 3 is a schematic structural view of a flexible display panel according to an embodiment of the present disclosure.

In another optional embodiment, as shown in FIG. 3, the quantum dot luminescent material 152 includes a second material, a third material and a fourth material, and the second material, the third material and the fourth material are respectively Corresponding to three sub-pixels in one pixel of the flexible display panel 1, wherein The second material is excited by the blue light emitted by the electroluminescent device 13 and converts the light into red light;

The third material is excited by the blue light emitted by the electroluminescent device 13 and converts the light into green light;

The fourth material transmits the blue light emitted by the electroluminescent device 13.

In an embodiment of the present disclosure, as shown in FIG. 3, the quantum dot luminescent material 152 in each quantum dot light-emitting area is pure-color quantum dots, that is, in each quantum dot light-emitting area, only one color of quantum dots is filled. In an embodiment of the present disclosure, the second material is red quantum dots, corresponding to the quantum light-emitting region 152R, the red quantum dots are converted into red light by the blue light emitted by the electroluminescent device 13; the third material is green quantum dots, which corresponds to the quantum light-emitting region 152G. The green quantum dots are excited by the blue light emitted by the electroluminescent device 13 and converts the light into green light. The fourth material is only provided with scattering particles but no quantum dots, and can directly transmit the blue light emitted by the electroluminescent device 13.

In an embodiment of the present disclosure, the blue light emitted by the electroluminescent device is converted by the corresponding monochromatic quantum dots, which effectively improves the conversion efficiency of the corresponding monochromatic quantum dots, and the blue light directly penetrates the fourth material to further improve the luminous efficiency. Moreover, the flexible display panel does not require a color film layer, which can further increase the optical transmittance, thereby reducing the power consumption of the flexible display panel.

Those skilled in the art select the arrangement order of the three sub-pixels in a pixel according to actual applications, so as to meet the design criteria of one pixel forming the flexible panel, which will not be repeated here.

In an embodiment of the present disclosure, the flexible display panel 1 further includes a polarizer arranged on the quantum dot luminescent material 152.

In an embodiment of the present disclosure, considering the light reflection problem of the monochromatic quantum dot luminescent material, this embodiment adjusts the light reflection brightness of the quantum dot beam by arranging a polarizer on the quantum dot luminescent material.

In an embodiment of the present disclosure, the process flow of the isolating portion of the flexible display panel 1 with mixed quantum dots as shown in FIG. 1 and the flexible display panel with pure-color quantum dots 1 as shown in FIG. 3 is the same, and will not be repeated here.

In the manufacturing process of the flexible display panel of pure color quantum dots of this embodiment, on the basis of the aforementioned formation of the isolation portion 151, the quantum dot luminescent material 152 of each pure color quantum dot is sequentially filled in the quantum dot light-emitting area, so that the quantum dots emit light. The material 152 is excited by the blue light emitted by the electroluminescent device 13 and outputs light beams corresponding to three sub-pixels in one pixel of the flexible display panel 1. For example, red quantum dots are filled in the quantum dot light-emitting area 152R to convert the blue light into red light, green quantum dots are filled in the quantum dot light-emitting area 152G to convert the blue light into green light, and the quantum dot light-emitting area 152B is not filled The quantum dot makes the blue light emitted by the electroluminescent device 13 directly permeable, thereby forming three sub-pixels of red, green and blue in one pixel of the flexible display panel 1. The isolation portion 151 and the quantum dot luminescent material 152 surrounding it form the quantum dot photoconversion layer 15 of the embodiment of the present disclosure.

Further, a polarizer is formed on the quantum dot photoconversion layer 15. Finally, a cover plate 16 is formed on the polarizer to form the pure-color quantum dot flexible display panel 1 of the embodiment of the present disclosure.

According to the present disclosure, the adjacent quantum dot luminescent materials are isolated through isolation portions, thereby reducing the influence on quantum dot luminescent materials due to excitation of adjacent pixels, and making the quantum dot beams after the quantum dot luminescent materials are excited by the electroluminescent device more concentrated, reducing the disordered scattering of the quantum dot beams, thereby reducing the color shift of the flexible display panel; on the other hand, the blue light emitted by the electroluminescent device is converted by the corresponding pure color quantum dots, effectively improving the corresponding pure color quantum conversion efficiency, the blue light directly penetrates the fourth material, further improving the conversion efficiency. Moreover, the flexible display panel does not require a color film layer, which can further increase the optical transmittance, thereby reducing the power consumption of the flexible display panel.

A flexible display device is further provided in the present disclosure, including a flexible display panel, where the flexible display panel includes:

a substrate;

thin film transistors arranged in an array on the substrate;

an electroluminescent device arranged on the thin film transistors and driven by the thin film transistors, including a pixel defining layer and an electroluminescent material defined by the pixel defining layer;

a thin film encapsulation layer on the electroluminescent device;

a quantum dot photoconversion layer on the thin film encapsulation layer, including an isolation portion and a quantum dot luminescent material surrounded by the isolation portion, where an orthographic projection of the isolation portion onto the substrate covers an orthographic projection of the pixel defining layer onto the substrate; and a cover plate arranged on the quantum dot photoconversion layer.

Optionally, the electroluminescent material is a blue light material, and the electroluminescent device is configured to emit blue light.

Optionally, the quantum dot luminescent material is a first material configured to emit white light after being excited by the blue light emitted by the electroluminescent device;

the flexible display panel further includes a color film layer on the quantum dot photoconversion layer and including a black matrix and a filter film defined by the black matrix, where an orthographic projection of the black matrix onto the substrate covers the orthographic projection of the isolation portion on the substrate;

an orthographic projection of the filter film onto the substrate covers an orthographic projection of the quantum dot luminescent material onto the substrate, where the filter film includes a red filter film, a green filter film and a blue filter film corresponding to three sub-pixels of each pixel of the flexible display panel.

Optionally, the first material includes mixed red quantum dots and green quantum dots.

Optionally, the quantum dot luminescent material includes a second material, a third material and a fourth material, and the second material, the third material and the fourth material respectively correspond to three sub-pixels in each pixel of the flexible display panel, where the second material is configured to emit red light after being excited by the blue light emitted by the electroluminescent device;

the third material is configured to emit green light after being excited by the blue light emitted by the electroluminescent device; and the fourth material is configured to transmit the blue light emitted by the electroluminescent device.

Optionally, the second material consists of red quantum dots, and the third material consists of green quantum dots.

Optionally, the flexible display panel further includes a polarizer arranged on the quantum dot luminescent material.

Optionally, a cross section of the isolation portion in a direction perpendicular to the substrate is one of a trapezoid, a rectangle and a triangle.

Figure 5:
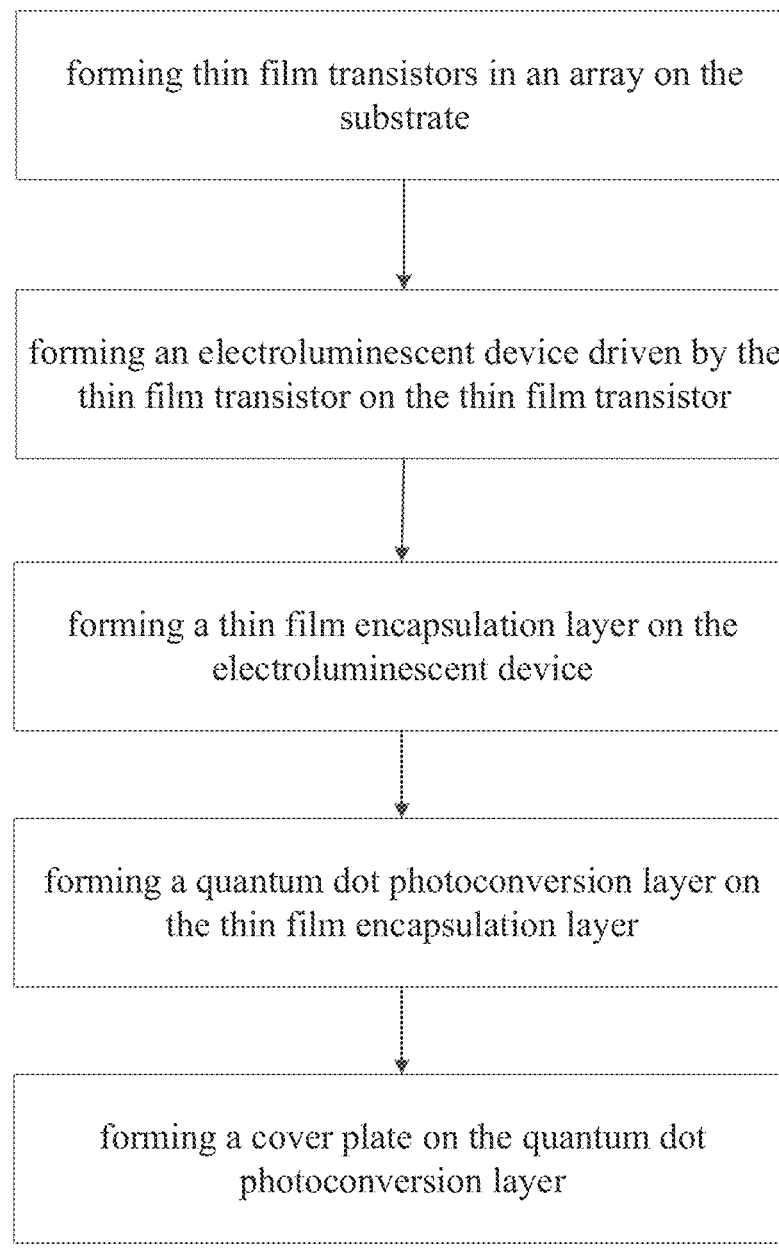
FIG. 5 is a flowchart of a method of forming a flexible display panel according to an embodiment of the present disclosure.

Corresponding to the flexible display panel provided by the foregoing embodiments, as shown in FIG. 1 and FIG. 5, an embodiment of the present application further provides a method of forming the foregoing flexible display panel, the method including:

forming an array of thin film transistors 12 on the substrate 11;

forming an electroluminescent device 13 driven by the thin film transistor 12 on the thin film transistor 12, and the electroluminescent device 13 includes a pixel defining layer and an electroluminescent material defined by the pixel defining layer;

forming a thin film encapsulation layer 14 on the electroluminescent device 13;

forming a quantum dot photoconversion layer 15 on the thin film encapsulation layer 14. The quantum dot photoconversion layer 15 includes an isolation portion 151 and a quantum dot luminescent material surrounded by the isolation portion 151. The isolation portion 151 is The orthographic projection on the substrate 11 covers the orthographic projection of the pixel defining layer on the substrate 11; and forming a cover plate 16 on the quantum dot photoconversion layer 15.

In an embodiment of the present disclosure, the manufacturing process of the flexible display panel is relatively simple. The flexible display panel formed by this process isolates adjacent quantum dot luminescent materials through isolation portions, thereby reducing the influence on quantum dot luminescent materials due to excitation of adjacent pixels, and making the quantum dot beams after the quantum dot luminescent materials are excited by the electroluminescent device more concentrated, reducing the disordered scattering of the quantum dot beams, thereby reducing the color shift of the flexible display panel, remedying the problems in the prior art. For specific implementations, refer to the foregoing embodiments, which will not be repeated here.

In an embodiment of the present disclosure, the electroluminescent material is a blue light material, the electroluminescent device 13 emits blue light, and the quantum dot luminescent material 152 is a first material, which is emitted by the electroluminescent device 13 white light is formed after being excited by the blue light, the method further includes:

forming a color film layer 17 on the quantum dot photoconversion layer 15. The color film layer 17 includes a black matrix 171 and a filter film (171R, 171G, and 171B) defined by the black matrix 171, where the orthographic projection of the black matrix 171 on the substrate covers the orthographic projection of the isolation portion 151 on the substrate, and the orthographic projection of the filter film on the substrate covers the quantum dot luminescent material 152 the orthographic projection on the substrate includes a red filter film 171R, a green filter film 171G, and a blue filter film 171B respectively corresponding to three sub-pixels of one pixel of the flexible display panel.

The flexible display panel formed by the mixed quantum dot luminescent material effectively improves the display effect on the basis of effectively reducing the color shift of the flexible display panel; and the wavelength of the monochromatic filter film is adjusted through the color film layer to realize the adjustment of the reflective brightness. The display effect is further improved, the problems existing in the prior art are compensated, the display effect of the flexible display panel is effectively improved, and it has a wide range of application prospects. For specific implementations, refer to the foregoing embodiments, which will not be repeated here.

In an embodiment of the present disclosure, the electroluminescent material is a blue light material, the electroluminescent device 13 emits blue light, and the quantum dot light emitting material 152 includes a second material, a third material, and a fourth material. The second material, the third material, and the fourth material respectively correspond to three sub-pixels in one pixel of the flexible display panel, wherein the second material is excited by the blue light emitted by the electroluminescent device 13 and converted into red Light, the third material is excited by the blue light emitted by the electroluminescent device 13 and converted into green light, and the fourth material transmits the blue light emitted by the electroluminescent device 13, and the method further includes:

forming a polarizer on the quantum dot luminescent material 152.

The flexible display panel formed of the pure-color quantum dot luminescent material effectively reduces the color shift of the flexible display panel, and effectively improves the conversion efficiency of the corresponding pure-color quantum dots. The blue light directly penetrates the fourth material to further improve the conversion efficiency. Moreover, the flexible display panel does not require a color film layer, which can further increase the optical transmittance, thereby reducing the power consumption of the flexible display panel.

For specific implementations, refer to the foregoing embodiments, which will not be repeated here. It is noted that the sequence of the steps in the flexible display panel manufacturing method provided by the embodiments of the present disclosure can be appropriately adjusted, and the steps can also be increased or decreased accordingly according to the situation. Within the scope, the methods that can be easily changed should be covered by the protection scope of the present disclosure, and therefore will not be repeated.

It is also noted that the flexible display panel proposed in the embodiment of the present disclosure is not limited to the specific structure formed by the manufacturing method of the above-mentioned embodiment of the present disclosure, and the flexible display panel can also be formed by those skilled in the art using other processing techniques.

Therefore, another embodiment of the present disclosure provides a display device including the above-mentioned flexible display panel. The display device can be any product or component with a flexible display function, such as a mobile phone, a tablet computer, a television, a monitor, a notebook computer, a digital photo frame, or a navigator.

Obviously, the above-mentioned embodiments of the present disclosure are merely examples to clearly illustrate the present disclosure, and are not intended to limit the implementation of the present disclosure. For those of ordinary skill in the art, they can also do on the basis of the above description. In addition to other different forms of changes or changes, it is not possible to list all the implementations here. Any obvious changes or changes derived from the technical solutions of the present disclosure are still within the scope of the present disclosure.

What is claimed is:

1. A flexible display panel, comprising:
   a substrate;
   thin film transistors arranged in an array on the substrate;
   an electroluminescent device arranged on the thin film transistors and driven by the thin film transistors, comprising a pixel defining layer and an electroluminescent material defined by the pixel defining layer;
   a thin film encapsulation layer on the electroluminescent device;
   a quantum dot photoconversion layer on the thin film encapsulation layer, comprising an isolation portion and a quantum dot luminescent material surrounded by the isolation portion, wherein an orthographic projection of the isolation portion onto the substrate covers an orthographic projection of the pixel defining layer onto the substrate; and
   a cover plate arranged on the quantum dot photoconversion layer;
   wherein the electroluminescent material is a blue light material, and the electroluminescent device is configured to emit blue light;
   wherein the quantum dot luminescent material is a first material configured to emit white light after being excited by the blue light emitted by the electroluminescent device;
   the flexible display panel further comprises a color film layer on the quantum dot photoconversion layer and comprising a black matrix and a filter film defined by the black matrix, wherein
   an orthographic projection of the black matrix onto the substrate covers the orthographic projection of the isolation portion on the substrate;
   an orthographic projection of the filter film onto the substrate covers an orthographic projection of the quantum dot luminescent material onto the substrate, wherein the filter film comprises a red filter film, a green filter film and a blue filter film corresponding to three sub-pixels of each pixel of the flexible display panel.

2. The flexible display panel according to claim 1, wherein the first material comprises mixed red quantum dots and green quantum dots.

3. The flexible display panel according to claim 1, wherein a cross section of the isolation portion in a direction perpendicular to the substrate is one of a trapezoid, a rectangle and a triangle.

4. A flexible display device, comprising a flexible display panel, wherein the flexible display panel comprises:
   a substrate;
   thin film transistors arranged in an array on the substrate;
   an electroluminescent device arranged on the thin film transistors and driven by the thin film transistors, comprising a pixel defining layer and an electroluminescent material defined by the pixel defining layer;

a thin film encapsulation layer on the electroluminescent device;

a quantum dot photoconversion layer on the thin film encapsulation layer, comprising an isolation portion and a quantum dot luminescent material surrounded by the isolation portion, wherein an orthographic projection of the isolation portion onto the substrate covers an orthographic projection of the pixel defining layer onto the substrate; and a cover plate arranged on the quantum dot photoconversion layer;

wherein the electroluminescent material is a blue light material, and the electroluminescent device is configured to emit blue light;

wherein the quantum dot luminescent material is a first material configured to emit white light after being excited by the blue light emitted by the electroluminescent device;

the flexible display panel further comprises a color film layer on the quantum dot photoconversion layer and comprising a black matrix and a filter film defined by the black matrix, wherein an orthographic projection of the black matrix onto the substrate covers the orthographic projection of the isolation portion on the substrate;

an orthographic projection of the filter film onto the substrate covers an orthographic projection of the quantum dot luminescent material onto the substrate, wherein the filter film comprises a red filter film, a green filter film and a blue filter film corresponding to three sub-pixels of each pixel of the flexible display panel.

5. The flexible display device according to claim 4, wherein the first material comprises mixed red quantum dots and green quantum dots.

6. The flexible display device according to claim 4, wherein a cross section of the isolation portion in a direction perpendicular to the substrate is one of a trapezoid, a rectangle and a triangle.

7. A method of forming the flexible display panel according to claim 1, comprising:

forming thin film transistors in an array on the substrate;

forming an electroluminescent device driven by the thin film transistor on the thin film transistor, wherein the electroluminescent device comprises a pixel defining layer and an electroluminescent material defined by the pixel defining layer;

forming a thin film encapsulation layer on the electroluminescent device;

forming a quantum dot photoconversion layer on the thin film encapsulation layer, wherein the quantum dot photoconversion layer comprises an isolation portion and a quantum dot luminescent material surrounded by the isolation portion, wherein an orthographic projection of the isolation portion onto the substrate covers an orthographic projection of the pixel defining layer onto the substrate; and forming a cover plate on the quantum dot photoconversion layer;

wherein the electroluminescent material is a blue light material, the electroluminescent device is configured to emit blue light, and the quantum dot luminescent material is a first material, and the quantum dot luminescent material is configured to emit white light after being excited by the blue light emitted by the electroluminescent device, and the method further comprises:

forming a color film layer on the quantum dot photoconversion layer, wherein the color film layer comprises a black matrix and a filter film defined by the black matrix, wherein an orthographic projection of the black matrix onto the substrate covers the orthographic projection of the isolation portion on the substrate;

an orthographic projection of the filter film onto the substrate covers an orthographic projection of the quantum dot luminescent material onto the substrate, wherein the filter film comprises a red filter film, a green filter film and a blue filter film corresponding to three sub-pixels of each pixel of the flexible display panel.

\* \* \* \* \*